(12) United States Patent
Russell et al.

(10) Patent No.: US 8,059,482 B2
(45) Date of Patent: Nov. 15, 2011

(54) MEMORY USING MULTIPLE SUPPLY VOLTAGES

(75) Inventors: Andrew C. Russell, Austin, TX (US); Prashant U. Kenkare, Austin, TX (US); Shayan Zhang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 253 days.

(21) Appl. No.: 12/487,791

(22) Filed: Jun. 19, 2009

(65) Prior Publication Data
US 2010/0322027 A1 Dec. 23, 2010

(51) Int. Cl.
*G11C 5/14* (2006.01)
(52) U.S. Cl. ............... 365/226; 365/189.11; 365/189.09
(58) Field of Classification Search .................. 365/226, 365/189.11, 189.09
See application file for complete search history.

(56) References Cited

U.S. PATENT DOCUMENTS

| | | | |
|---|---|---|---|
| 5,959,926 A * | 9/1999 | Jones et al. ................... | 365/226 |
| 6,556,471 B2 | 4/2003 | Chappell et al. | |
| 7,292,495 B1 | 11/2007 | Kenkare et al. | |
| 7,489,582 B1 | 2/2009 | Barth, Jr. et al. | |
| 7,825,720 B2 | 11/2010 | Ramaraju et al. | |

OTHER PUBLICATIONS

Hamzaoglu, Fatih et al.; "A 3.8 Ghz 153 Mb SRAM Design With Dynamic Stability Enhancement and Leakage Reduction in 45 nm High-k Metal Gate CMOS Technology"; IEEE Journal of Solid-State Circuits; Jan. 2009; pp. 148-154; vol. 44, No. 1; IEEE.
Zhang, Kevin et al.; "A 3GHz 70-Mb SRAM in 65-nm CMOS Technology With Integrated Column-Based Dynamic Power Supply"; Jan. 2006; pp. 146-151; vol. 41, No. 1; IEEE.

* cited by examiner

*Primary Examiner* — Son Dinh
*Assistant Examiner* — Nam T Nguyen
(74) *Attorney, Agent, or Firm* — Joanna C. Chiu; James L. Clingan, Jr.

(57) ABSTRACT

A memory has a method of operating that includes performing operations of a first type and a second type. A first voltage is coupled to a power supply node of a first memory cell of a memory array during a first operation of the first type. The first voltage is decoupled from the power supply node in response to terminating the first operation of the first type so as to allow the power supply node to drift. If the power supply node drifts to a second voltage, a power supply source is coupled to the power supply node. This is useful in reducing power in the circuit that produces the first voltage.

20 Claims, 3 Drawing Sheets

MEMORY USING MULTIPLE SUPPLY VOLTAGES

BACKGROUND

1. Field

This disclosure relates generally to memories, and more specifically, to a memory which transitions between multiple supply voltages.

2. Related Art

As processor voltages are decreased to lower power, bitcell read margin decreases and hence limits the minimum memory operating voltage. Therefore, during a read access to a memory, bitcell read margin can be increased by boosting the voltage to the bitcell. However, this boosted voltage can lead to higher leakage currents when the memory is not being accessed.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In order to increase bitcell read margins, the voltage to the bitcell can be boosted to a higher supply voltage level. However, if this boosted voltage is maintained when the memory is not being accessed, leakage current is undesirably increased. Furthermore, if this boosted voltage is actively switched back to a lower voltage after the read, the voltage needs to again be boosted from this lower voltage for a subsequent read. However, if this switching needs to be done too often, such as during successive reads, more power may be burned than saved since the dynamic power consumption from switching the voltage supply of the bitcell may exceed the leakage power savings from being switched to the lower voltage. Therefore, in one embodiment of the present invention, when a read or a write operation on the memory is not occurring, the voltage supply node of the bitcell is not immediately actively driven to a lower voltage but is instead allowed to float so that bitcell leakage current pulls the voltage supply node low. Upon the voltage of the floating voltage supply node drifting down to a predetermined voltage level, a power supply terminal, which has a voltage at the predetermined voltage level, is coupled to the voltage supply node to prevent the node from further drifting down and adversely affecting data retention.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Figure 1:
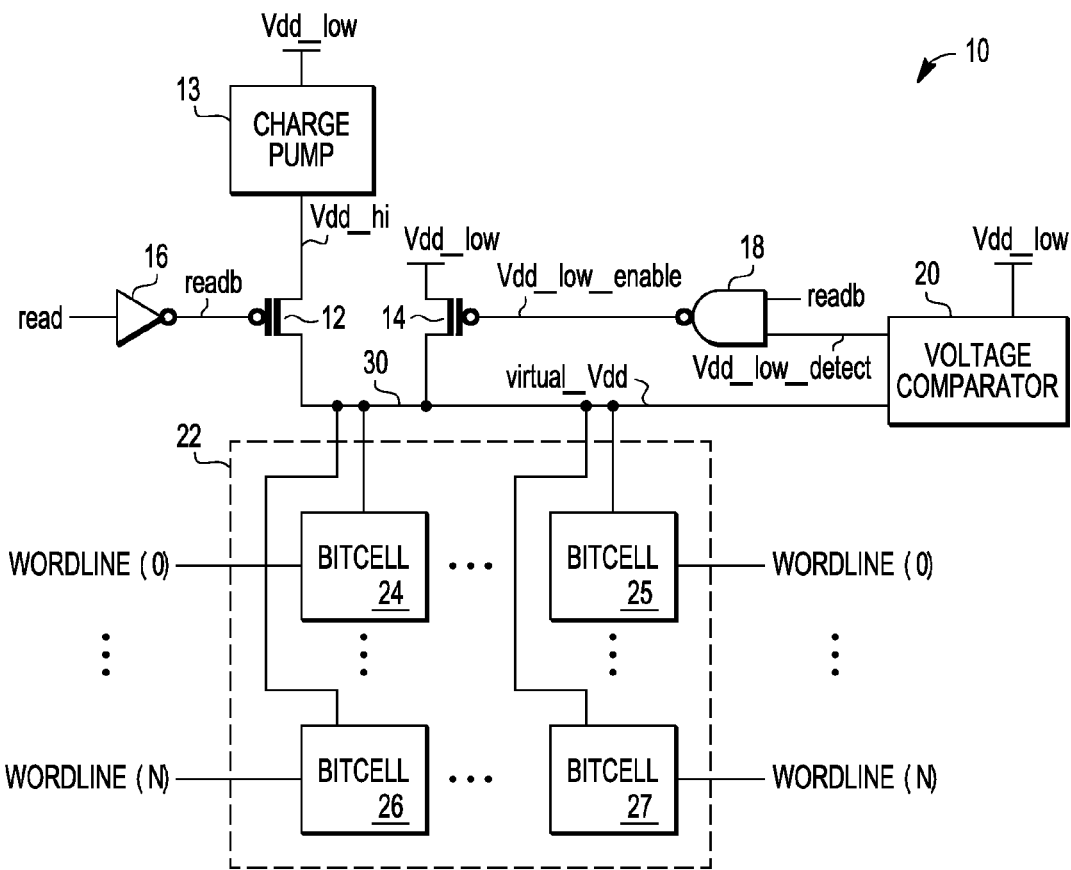
FIG. 1 illustrates, in partial schematic and partial block diagram form, a memory in accordance with one embodiment of the present invention.

FIG. 1 illustrates a memory 10 in accordance with one embodiment of the present invention. Memory 10 includes an inverter 16, a charge pump 13, a P channel transistor 12, a P channel transistor 14, a NAND gate 18, a voltage comparator 20, and a memory array 22. (Note that transistors 12 and 14 may also be referred to as switching devices.) Inverter 16 receives a read signal, read, at an input of inverter 16 and provides the inverse of the read signal, readb, at an output of inverter 16. Charge pump 13 generates a first power supply, Vdd_hi, from a second power supply, Vdd_low. Transistor 12 has a first current electrode coupled to charge pump 13 to receive Vdd_hi, a second current electrode coupled to a circuit node 30, and a control electrode (also referred to as a gate) coupled to the output of inverter 16 to receive readb. Transistor 14 has a first current electrode coupled to a second power supply node which receives the second power supply, Vdd_low, a second current electrode coupled to circuit node 30, and a control electrode (also referred to as a gate) coupled to an output of NAND gate 18 to receive a Vdd_low_enable signal (also referred to as a power enable signal). (Note that the second power supply node may also be referred to as a power supply terminal which has a voltage at Vdd_low.) NAND gate 18 receives readb at a first input, a Vdd_low_detect signal at a second input, and provides Vdd_low_enable at its output. Voltage comparator 20 receives Vdd_low and is coupled to circuit node 30 and provides Vdd_low_detect to the second input of NAND gate 18. Circuit node 30 is coupled to memory array 22.

Memory array 22 includes a plurality of bitcells, such as bitcells 24, 25, 26, and 27, arranged into one or more rows and one or more columns. In the illustrated embodiment, array 22 includes N+1 rows, and a wordline signal of wordline signals (0:N) is provided to each row of array 22. Circuit node 30 is coupled to each of the bitcells in array 22. Circuit node 30 operates as the power supply node of each bitcell, and thus may be referred to as a power supply node of each bitcell or may be referred to as virtual_Vdd. In one embodiment, array 22 is a static random access memory (SRAM) array in which circuit node 30 is coupled to the source terminals of the pair of P channel transistors in each SRAM bitcell. In one embodiment, circuit node 30 is coupled to each bitcell in array 22. However, in alternate embodiments, circuit node 30 may be coupled to each bitcell in a particular row or in a particular column of array 22, where each row or each column may be coupled to a separate virtual_Vdd. Note that operation of memory array 22 is known in the art and therefore will not be described in further detail herein.

In the illustrated embodiment, Vdd_hi is greater than Vdd_low. In one embodiment, Vdd_low is boosted by charge pump 13 to the level of Vdd_hi which is the boosted voltage used as the read voltage during read operations and can be provided by charge pump 13. In alternate embodiments, Vdd_hi can be provided by another voltage source or power supply generator. In one embodiment, Vdd_low is a voltage that may be used as the write voltage during a write operation. In one embodiment, Vdd_low is a standby voltage that is used during standby in which no read or write operation is being performed. Also, as will be described in more detail below, Vdd_low is also used as a drift limit for virtual_Vdd. In one embodiment, memory 10 is located on an integrated circuit and Vdd_low is supplied external to the integrated circuit.

In operation, during a read operation to memory array 22, a first voltage, Vdd_hi, is provided to circuit node 30, thus virtual_Vdd, during the read operation, is coupled to Vdd_hi. In this manner, a boosted voltage (as compared to Vdd_low) is provided during read operations. During a read operation, read is asserted (a logic level 1) and thus readb, at the output of inverter 16, is a logic level 0. This turns on transistor 12, thus coupling Vdd_hi to virtual_Vdd. Also, during the read operation, the output of NAND gate 18 is a logic level 1 (due to readb being a logic level 0), thus ensuring that transistor 14 remains off.

Upon terminating the read operation (when read is negated, thus becoming a logic level 0), transistor 12 is turned off and Vdd_hi is decoupled from virtual_Vdd. Virtual_vdd, at this point, is decoupled from any supply voltage (including Vdd_low, since, upon termination of a read operation, Vdd_low_enable is initially at a logic level 1, preventing transistor 14 from coupling Vdd_low to virtual_Vdd). With virtual_Vdd being decoupled from any supply voltage, it begins to drift downward due to bitcell leakage. Voltage comparator 20, upon detecting that virtual_Vdd drifts to Vdd_low (which may be referred to as the drift limit for voltage comparator 20), it will assert Vdd_low_detect which, when readb is a logic level 1, causes Vdd_low_enable to be a logic level 0, thus turning on transistor 14 and coupling Vdd_low to virtual_Vdd (i.e., coupling a power supply terminal having a voltage at Vdd_low to virtual_Vdd). This prevents virtual_Vdd from continuing to drift below Vdd_low.

Therefore, in one embodiment, voltage comparator 20 compares the voltage of virtual_Vdd to Vdd_low, and, if virtual_Vdd is greater than Vdd_low, voltage comparator 20 negates Vdd_low_detect (sets it to a logic level 0) and if virtual_Vdd is less than or equal to Vdd_low, voltage comparator 20 asserts Vdd_low_detect (sets it to a logic level 1). When the read operation is terminated, readb is at a logic level 1, and the output of NAND gate 18 remains a logic level 1 while virtual_Vdd remains above Vdd_low, thus maintaining transistor 14 off. However, once virtual_Vdd reaches Vdd_low, then the output of NAND gate 18 becomes a logic level 0 and turns on transistor 14 to ensure that virtual_Vdd does not continue to drift downwards. Therefore, so long as read operations are not occurring, once virtual_Vdd drifts to Vdd_low, it can be maintained at Vdd_low. However, if, after a current read operation, a next read operation is initiated before virtual_Vdd drifts down to Vdd_low, virtual_Vdd can again be coupled to Vdd_hi, and less effort would be required to raise virtual_Vdd back to Vdd_hi as compared to the situation when virtual_Vdd is at Vdd_low upon initiating a next read operation. Note also that by using the same voltage level (e.g. Vdd_low) at the power supply terminal coupled to the first current electrode of switching device 14 as the drift limit for virtual_Vdd for determining when to couple the power supply terminal to virtual_Vdd, an additional reference voltage is not needed for setting the drift limit for virtual_Vdd. That is, voltage comparator 20 need not receive another voltage level with which to compare virtual_Vdd to determine when to assert Vdd_low detect. Vdd_low is used both as the drift limit and as the second supply which is coupled to virtual_Vdd to prevent virtual_Vdd from continuing to drift further below the drift limit.

Figure 2:
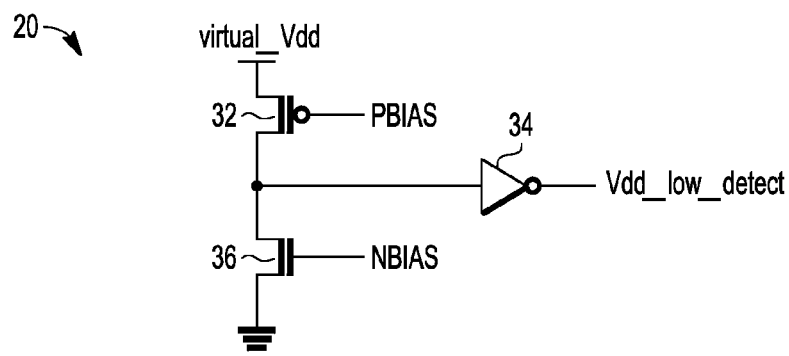
FIG. 2 illustrates, in schematic form, a voltage comparator of the memory of FIG. 1, in accordance with one embodiment of the present invention.

FIG. 2 illustrates one example of voltage comparator 20. In FIG. 2, voltage comparator 20 includes a P channel transistor 32, an N channel transistor 36, and an inverter 34. Transistor 32 includes a first current electrode coupled to virtual_Vdd (circuit node 30), a second current electrode coupled to an input of inverter 34, and a control electrode coupled to receive a bias signal, PBIAS. Transistor 36 includes a first current electrode coupled to the input of inverter 34, a second current electrode coupled to ground, and a control electrode coupled to receive a bias signal, NBIAS. The output of inverter 34 provides Vdd_low_detect which is negated (a logic level 0) when virtual_Vdd is greater than Vdd_low and is asserted (a logic level 1) when virtual_Vdd reaches Vdd_low. For example, in one embodiment, Vdd_low may be used to set PBIAS and NBIAS to appropriate levels via voltage division which in turn set the relative strengths of transistor 32 and transistor 36. Therefore, when virtual_Vdd is greater than Vdd_low, the strength of transistor 32 is sufficient to maintain the input to inverter 34 high enough such that Vdd_low_detect is negated. However, as virtual_Vdd drifts downwards, the drive strength of transistor 32 weakens and the strength of transistor 36 eventually takes over, pulling the input to inverter 34 to ground, thus causing the Vdd_low detect to be asserted. Based on the relative strengths of transistors 34 and 36, the input to inverter 34 is pulled to ground at the point at which virtual_Vdd reaches Vdd_low. In alternate embodiments, another predetermined voltage, other than Vdd_low can be used to set PBIAS and NBIAS. Also, in one embodiment, PBIAS and NBIAS may be programmable, such as, for example, to account for process variations.

In the illustrated embodiments of FIGS. 1 and 2, voltage comparator 20 compares virtual_Vdd to Vdd_low to determine when to turn on transistor 14. However, in alternate embodiments, voltage comparator 20 may compare virtual_Vdd to another predetermined voltage, other than Vdd_low, to determine when to turn on transistor 14. Also, any type of circuitry may be used to implement voltage comparator 20.

Figure 3:
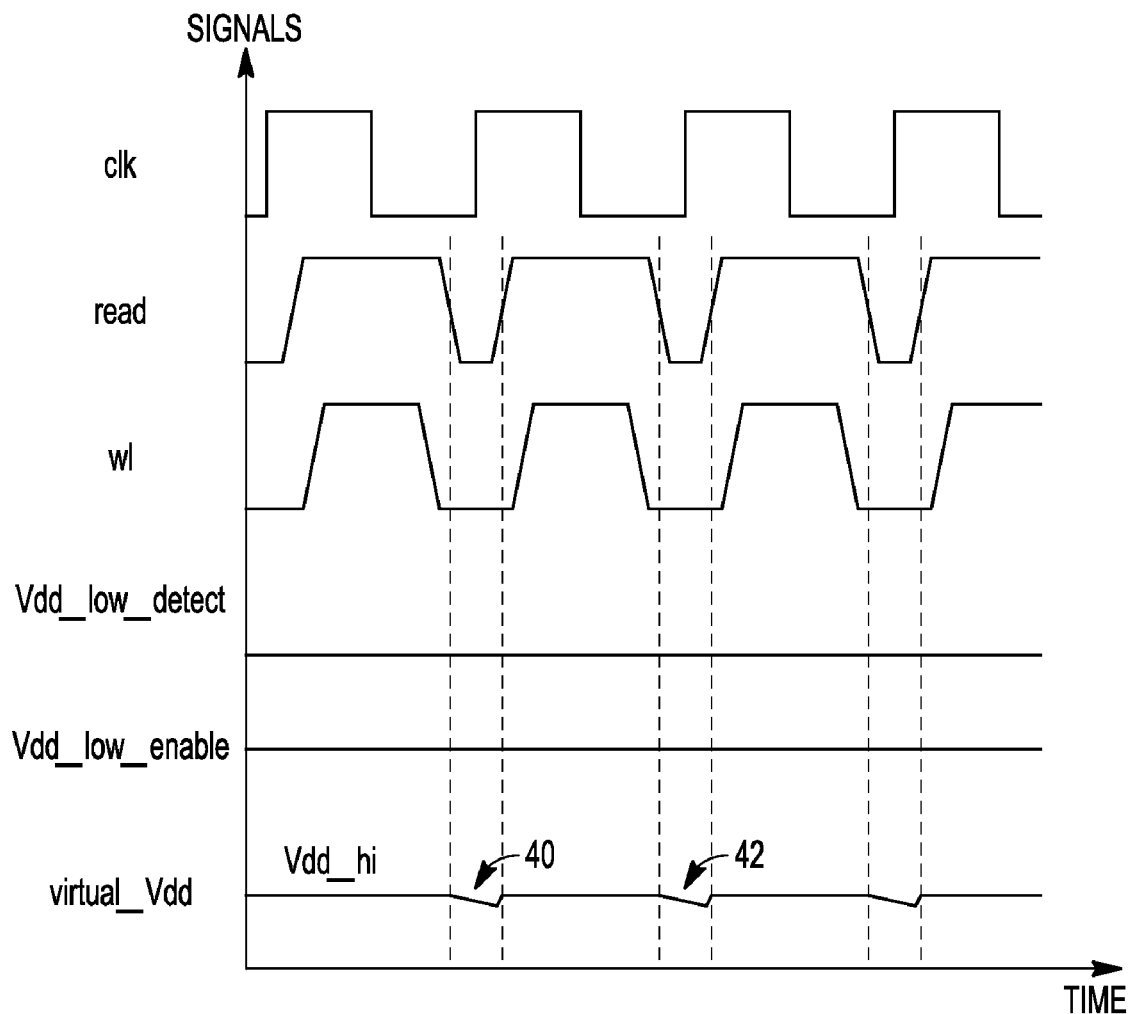
FIGS. 3 and 4 illustrate timing diagrams of the operation of the memory of FIG. 1, in accordance with various examples of the present invention.
Figure 4:
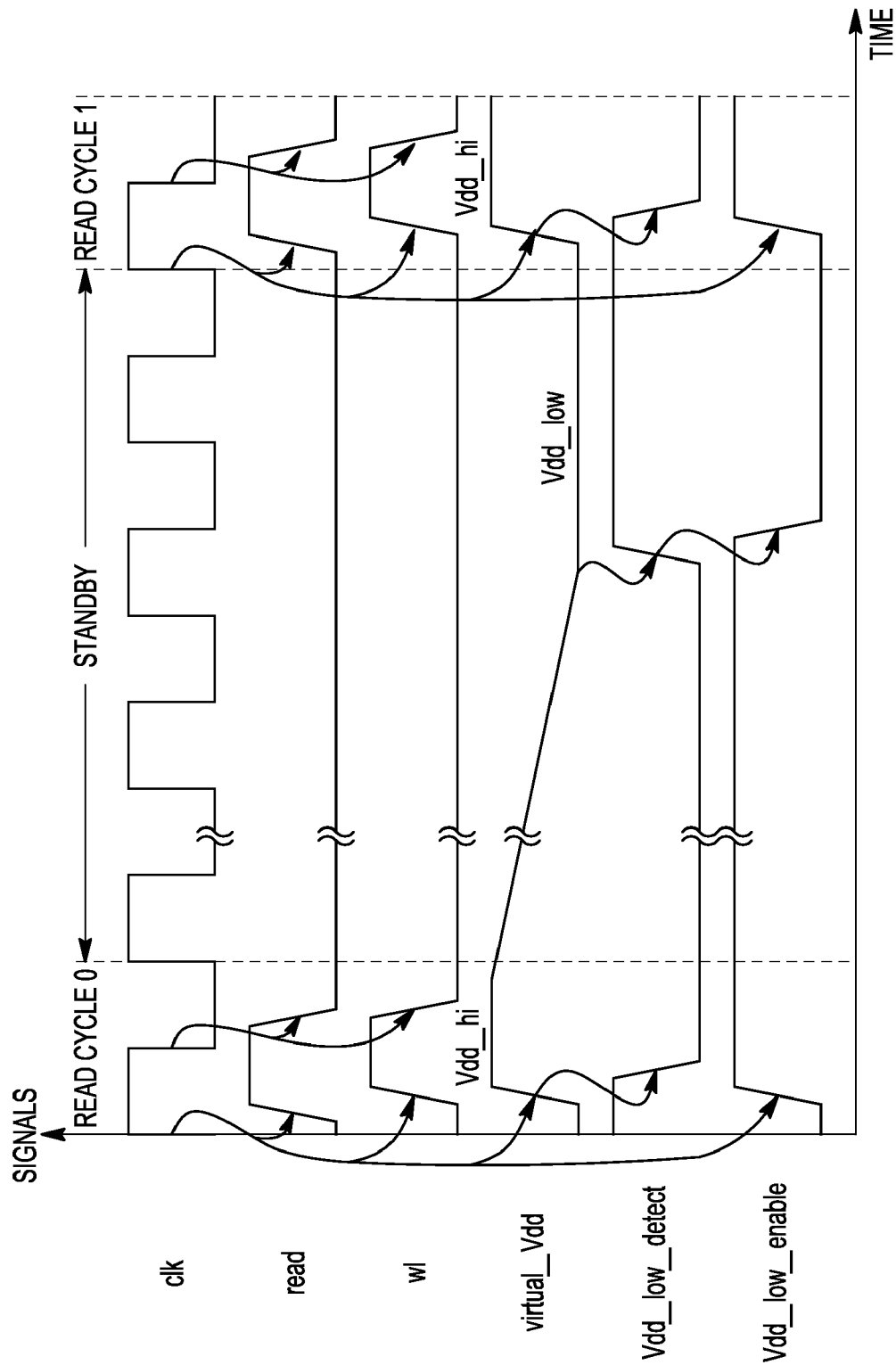

Operation of memory 10 can be further understood in reference to the timing diagrams of FIGS. 3 and 4. Referring to FIG. 3, operation of memory 10 is shown in which successive read operations are performed. That is, in the example of FIG. 3, a read operation is performed in each of 4 successive clock cycles. Note that for each read operation, first read is asserted to a logic level 1 after the rising edge of the clock. Then, after read is asserted, the appropriate wordline signal (wl) is enabled for the bitcell being accessed. At this point, the read operation is performed where the value stored in the bitcell being accessed is sensed (which can be performed using known circuitry). Upon completion of the sensing for the read operation, wl is negated to a logic level 0, and afterwards, read is negated to a logic level 0, thus terminating the read operation. Therefore, this occurs in each of the 4 clock cycles illustrated. Upon assertion of the read signal, note that Vdd_low_detect is at a logic level 0, Vdd_low enable is at a logic level one, and virtual_Vdd is coupled to Vdd_hi. Upon terminating the read operation (when read is negated), virtual_Vdd is decoupled from Vdd_hi and begins to drift downward due to bitcell leakage, as can be seen by ripple 40 in FIG. 3. Voltage comparator 20 monitors virtual_Vdd to see if it falls to Vdd_low. However, since a read operation is again initiated at the next clock cycle with read being again asserted, virtual_Vdd is again coupled to Vdd_hi. Therefore, virtual_Vdd returns to Vdd_hi, and never has the chance to drift downwards all the way to Vdd_low. Since virtual_Vdd never drifts down to Vdd_low, note that Vdd_low detect remains at a logic level 0 and thus Vdd_low_enable remains at a logic level 1. Note that at the end of the next read operation, virtual_Vdd again drifts downwards, resulting in ripple 42. But again, due to yet another subsequent read operation, virtual_Vdd does not drift down to Vdd_low.

Note that upon initiating the second read operation in the example of FIG. 3, energy is further conserved since virtual_Vdd need not be boosted to Vdd_hi from Vdd_low, but is instead boosted from a voltage level that is higher than Vdd_low. Therefore, in between successive read operations, virtual_Vdd is not actively switched to a lower voltage but is instead allowed to drift, thus preventing the loss of power incurred when having to actively switch to a lower voltage supply, such as Vdd_low, before actively switching back to a higher voltage supply, such as Vdd_hi.

FIG. 4 illustrates a timing diagram of an example in which successive read operations do not occur, and instead, virtual_Vdd, upon being decoupled from Vdd_hi, drifts down far enough to cause voltage comparator 20 to assert Vdd_low_detect and thus enable transistor 14 to couple virtual_Vdd to Vdd_low. Referring to FIG. 4, note that the assertion of the read and wl signals occurs in the same manner as described above in reference to FIG. 3. During the first read operation, in Read Cycle0, read and wl are asserted to logic level ones and virtual_Vdd is coupled to Vdd_hi. Also, Vdd_low detect is negated to a logic level 0 (since virtual_Vdd is greater than Vdd_low) and Vdd_low_enable is asserted to a logic level one, thus maintaining transistor 14 off. After the first read operation terminates with the negation of read to a logic level 0, virtual_Vdd is decoupled from Vdd_hi. In the example of FIG. 4, memory 10 is not accessed in the subsequent clock cycle, therefore virtual_Vdd continues to drift downwards due to bitcell leakage. As long as memory 10 does not receive a read access or a write access, it remains in standby and virtual_Vdd continues to drift. Upon virtual_Vdd drifting down to Vdd_low, voltage comparator 20 asserts Vdd_low_detect which results in Vdd_low_enable being negated to a logic level 0. At this point, virtual_Vdd is coupled to Vdd_low and thus remains at Vdd_low. In one embodiment, Vdd_low is sufficient for data retention (such that data stored in the bitcell or bitcells coupled to Vdd_low is retained). Upon a subsequent read operation, in Read Cycle1, virtual_Vdd is again coupled to Vdd_hi, and Vdd_low_detect is again negated by voltage comparator 20.

In one embodiment, during a write operation of a bitcell of memory array 10, virtual_Vdd is coupled to Vdd_low. Therefore, in one embodiment, additional circuitry (not shown) is present which selectively couples virtual_Vdd to Vdd_low in response to a write signal. In an alternate embodiment, a different voltage can be coupled to virtual_Vdd during a write operation other than Vdd_low. This different voltage can be higher or lower than Vdd_low.

Therefore, although virtual_Vdd is initially allowed to float after termination of a read operation, it can be appreciated how the ability to prevent virtual_Vdd from drifting below a drift limit (e.g. Vdd_low) can prevent the loss of data when a read or write operation is not occurring. In response to virtual_Vdd reaching the drift limit, virtual_Vdd can be coupled to a power supply terminal which has a voltage at the same drift limit (e.g. Vdd_low) to ensure that virtual_Vdd does not continue to drift downwards and to ensure data retention. By using the voltage level of this power supply terminal as the drift limit, the need for any additional reference voltages, such as for providing a drift limit, may be prevented.

Note also that the embodiments described above also apply to the case of a virtual ground rather than a virtual_Vdd node. That is, the N channel transistors in the cross-coupled inverters of each bitcell can be coupled to a virtual ground rather than a ground node. In this manner, during a read operation, the virtual ground node can be coupled to ground (or a voltage lower than ground) and, upon termination of the read operation, the virtual ground node can be allowed to float and thus drift upwards. A voltage comparator can be used to monitor the virtual ground node such that when it drifts to a predetermined higher voltage, a second higher voltage can be coupled to the virtual ground node to ensure it does not continue to drift upwards due to bitcell leakage. Therefore, circuitry similar to that shown in FIGS. 1 and 2 can be used to implement a virtual ground node embodiment, where the polarities would have to be reversed appropriately, and circuitry modified appropriately. For example, N channel transistors would be used in place of P channel transistors 12 and 14, and during a read operation, rather than using a boosted voltage, such as Vdd_hi, a voltage lower than ground would be used for read assist. In this case, the second voltage enabled by the voltage comparator would be a higher voltage than the voltage used during a read operation and would be used to reduce array leakage and prevent the virtual ground node from further drifting upwards beyond this second voltage and adversely affecting data retention.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

In one embodiment, the illustrated elements of memory 10 are circuitry located on a single integrated circuit or within a same device. Alternatively, system 10 may include any number of separate integrated circuits or separate devices interconnected with each other. Memory 10 may be a stand-alone memory or an embedded memory.

Although the invention is described herein with reference to specific embodiments, various modifications and changes can be made without departing from the scope of the present invention as set forth in the claims below. For example, rather than implementing a virtual_Vdd node, a virtual_ground node may instead be implemented. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

The following are various embodiments of the present invention.

Item 1 includes a method of operating a memory for performing operations of a first type and a second type where the method includes coupling a first voltage at a first level to a power supply node of a first memory cell of a memory array during a first operation of the first type; decoupling the first voltage from the power supply node in response to terminating the first operation of the first type so as to allow the power supply node to drift; and in response to detecting that the power supply node drifts to a voltage at a second level, wherein a power supply terminal has a voltage at the second level, coupling the power supply node to the power supply terminal to maintain the power supply node at the second level. Item 2 includes the method of item 1 and further includes if a second operation of the first type is initiated before the power supply node drifts to the second level, coupling the first voltage to the power supply node. Item 3 includes the method of item 1 and further includes generating the first voltage by charge pumping. Item 4 includes the method of item 3 and further includes performing a first operation of the second type with the power supply node at the second level. Item 5 includes the method of item 4, wherein the first operation of the first type is a first read operation, and the method further includes if a second read operation is initiated before the power supply node drifts to the second level, coupling the first voltage to the power supply node. Item 6 includes the method of item 3 wherein the step of generating is further characterized by the charge pumping using the voltage at the power supply terminal to generate the first voltage so that the first level is greater than the second level. Item 7 includes the method of item 1 and further includes coupling a voltage at a third level greater than the second level and less than the first level to the power supply node in response to initiating a first operation of the second type. Item 8 includes the method of item 1 wherein the memory includes an integrated circuit and the voltage at the power supply terminal is supplied external to the integrated circuit. Item 9 includes the method of item 1 wherein the first type is a read, the second type is a write, and the first level is less than the second level. Item 10 includes the method of item 1 wherein, the step of coupling a power supply node to the power supply terminal results in a voltage at the power supply node such that data present in the first memory cell is retained and the power supply node is able to be charged to the first level so as to perform a read operation of the first memory cell. Item 11 includes the method of item 1 wherein the memory has an array that is arranged in a plurality of columns of memory cells, wherein all memory cells of a first column of the plurality of columns, including the first memory cell, are coupled to the power supply node. Item 12 includes the method of item 1 wherein the memory has an array that is arranged in a plurality of rows of memory cells, wherein all memory cells of a first row of the plurality of rows, including the first memory cell, are coupled to the power supply node. Item 13 includes the method of item 1 wherein the memory has an array of memory cells including the first memory cell, wherein all memory cells of the array are coupled to the power supply node.

Item 14 includes a memory formed on an integrated circuit, including a memory array having a plurality of memory cells including a first memory cell having a power supply node; a first power supply generator, coupled to a power supply terminal, having an output terminal providing a voltage at a first level; a first switching device that couples the power supply node to the output terminal during a first operation of a first type and decoupling the power supply node from the output terminal in response to a termination of the first operation of the first type; and a second switching device that couples the power supply node to the power supply terminal in response to detecting that the power supply node has drifted to a voltage at a second level, wherein a voltage present at the power supply terminal has the second level. Item 15 includes the memory of item 14 wherein the first switching device includes a first transistor having a control electrode for receiving a read signal, a first current electrode coupled to the power supply node, and a second current electrode coupled to the output terminal. Item 16 includes the memory of item 15 wherein the second switching device includes a second transistor having a gate for receiving a power enable signal, a first current electrode coupled to the power supply terminal, and a second current electrode coupled to the power supply node. Item 17 includes the memory of item 16 and further includes a comparator having a first input coupled to the power supply terminal, a second input coupled to the power supply node, and an output coupled to the gate of the second switching device. Item 185 includes the memory of item 17 wherein the first type is a read.

Item 19 includes a method of operating a memory including coupling a read voltage to a power supply node of a first memory cell of a memory array during a first read operation, wherein the read voltage is at a first level; decoupling the read voltage from the power supply node in response to terminating the first read operation to allow the power supply node to drift downward; coupling a power supply source having a voltage at a second level to the power supply node in response to power supply node drifting to the second level; and in response to initiating a second read operation, coupling the read voltage to the power supply node. Item 20 includes the method of item 19 and further includes in response to initiating a write operation, coupling a write voltage having one of a group consisting of the second level and a third level, wherein the third level is different than the second level and less than the first level.

What is claimed is:

1. A method of operating a memory for performing operations of a first type and a second type, comprising:
coupling a first voltage at a first level to a power supply node of a first memory cell of a memory array during a first operation of the first type;
decoupling the first voltage from the power supply node in response to terminating the first operation of the first type so as to allow the power supply node to drift; and
in response to detecting that the power supply node drifts to a voltage at a second level, wherein a power supply terminal has a voltage at the second level, coupling the power supply node to the power supply terminal to maintain the power supply node at the second level.

2. The method of claim 1, further comprising:
if a second operation of the first type is initiated before the power supply node drifts to the second level, coupling the first voltage to the power supply node.

3. The method of claim 1, further comprising:
generating the first voltage by charge pumping.

4. The method of claim 3, further comprising performing a first operation of the second type with the power supply node at the second level.

5. The method of claim 4, wherein the first operation of the first type is a first read operation, further comprising:
if a second read operation is initiated before the power supply node drifts to the second level, coupling the first voltage to the power supply node.

6. The method of claim 3, wherein the step of generating is further characterized by the charge pumping using the voltage at the power supply terminal to generate the first voltage so that the first level is greater than the second level.

7. The method of claim 1, further comprising:
coupling a voltage at a third level greater than the second level and less than the first level to the power supply node in response to initiating a first operation of the second type.

8. The method of claim 1, wherein the memory comprises an integrated circuit and the voltage at the power supply terminal is supplied external to the integrated circuit.

9. The method of claim 1, wherein the first type is a read, the second type is a write, and the first level is less than the second level.

10. The method of claim 1, wherein, the step of coupling a power supply node to the power supply terminal results in a voltage at the power supply node such that data present in the first memory cell is retained and the power supply node is able to be charged to the first level so as to perform a read operation of the first memory cell.

11. The method of claim 1 wherein the memory has an array that is arranged in a plurality of columns of memory cells, wherein all memory cells of a first column of the plurality of columns, including the first memory cell, are coupled to the power supply node.

12. The method of claim 1 wherein the memory has an array that is arranged in a plurality of rows of memory cells, wherein all memory cells of a first row of the plurality of rows, including the first memory cell, are coupled to the power supply node.

13. The method of claim 1 wherein the memory has an array of memory cells including the first memory cell, wherein all memory cells of the array are coupled to the power supply node.

14. A memory formed on an integrated circuit, comprising:
a memory array having a plurality of memory cells including a first memory cell having a power supply node;
a first power supply generator, coupled to a power supply terminal, having an output terminal providing a voltage at a first level;
a first switching device that couples the power supply node to the output terminal during a first operation of a first type and decoupling the power supply node from the output terminal in response to a termination of the first operation of the first type; and
a second switching device that couples the power supply node to the power supply terminal in response to detecting that the power supply node has drifted to a voltage at a second level, wherein a voltage present at the power supply terminal has the second level.

15. The memory of claim 14, wherein the first switching device comprises a first transistor having a control electrode for receiving a read signal, a first current electrode coupled to the power supply node, and a second current electrode coupled to the output terminal.

16. The memory of claim 15, wherein the second switching device comprises a second transistor having a gate for receiving a power enable signal, a first current electrode coupled to the power supply terminal, and a second current electrode coupled to the power supply node.

17. The memory of claim 16, further comprising a comparator having a first input coupled to the power supply terminal, a second input coupled to the power supply node, and an output coupled to the gate of the second switching device.

18. The memory of claim 17, wherein the first type is a read.

19. A method of operating a memory, comprising:
coupling a read voltage to a power supply node of a first memory cell of a memory array during a first read operation, wherein the read voltage is at a first level;
decoupling the read voltage from the power supply node in response to terminating the first read operation to allow the power supply node to drift downward;
coupling a power supply source having a voltage at a second level to the power supply node in response to power supply node drifting to the second level; and
in response to initiating a second read operation, coupling the read voltage to the power supply node.

20. The memory of claim 19, further comprising:
in response to initiating a write operation, coupling a write voltage having one of a group consisting of the second level and a third level, wherein the third level is different than the second level and less than the first level.

* * * * *